United States Patent [19]

Kobayashi

[11] Patent Number: 5,565,800
[45] Date of Patent: Oct. 15, 1996

[54] COMPARATOR CIRCUIT AND METHOD OF CONTROLLING COMPARATOR CIRCUIT

[75] Inventor: Kenichi Kobayashi, Tokyo, Japan

[73] Assignee: Seiko Instruments Inc., Japan

[21] Appl. No.: 282,032

[22] Filed: Jul. 28, 1994

[30] Foreign Application Priority Data

Jul. 30, 1993 [JP] Japan .................................. 5-190574

[51] Int. Cl.⁶ ................................................ H03K 5/22
[52] U.S. Cl. .............................. 327/65; 327/54; 327/69; 327/91
[58] Field of Search ............................ 327/91, 94, 95, 327/96, 58, 63, 65, 67, 52, 54, 69, 71, 75, 90

[56] References Cited

U.S. PATENT DOCUMENTS

| | | | |
|---|---|---|---|
| 4,237,390 | 12/1980 | Buurma | 307/362 |
| 4,547,683 | 10/1985 | Bingham | 307/355 |
| 4,560,890 | 12/1985 | Masuda et al. | 307/355 |
| 4,633,222 | 12/1986 | Dingwall | 327/91 |
| 4,728,811 | 3/1988 | Iida et al. | 327/91 |
| 4,845,383 | 7/1989 | Iida | 327/91 |
| 4,900,952 | 2/1990 | Hosotani et al. | 307/355 |
| 5,012,244 | 4/1991 | Wellard et al. | 341/143 |
| 5,028,815 | 7/1991 | Van De Plassche | 307/355 |
| 5,113,090 | 5/1992 | Imaizumi et al. | 307/355 |
| 5,258,664 | 11/1993 | White | 327/91 |
| 5,289,420 | 2/1994 | Neu | 365/203 |
| 5,304,866 | 4/1994 | Uranaka | 327/94 |
| 5,341,050 | 8/1994 | Mellissinos et al. | 327/91 |

FOREIGN PATENT DOCUMENTS

| | | |
|---|---|---|
| 101571 | 2/1984 | European Pat. Off. . |
| 150606 | 8/1985 | European Pat. Off. . |
| 145100 | 4/1987 | European Pat. Off. . |
| 465249 | 1/1992 | European Pat. Off. . |
| 488893 | 6/1992 | European Pat. Off. . |
| 2536922 | 6/1984 | France . |
| 2222330 | 2/1990 | United Kingdom . |
| 8303932 | 11/1983 | WIPO . |

*Primary Examiner*—Timothy P. Callahan
*Assistant Examiner*—My-Trang Nu Ton
*Attorney, Agent, or Firm*—Adams & Wilks

[57] ABSTRACT

Switch circuits 21 and 22 are opened before switch circuits 31 and 32 are opened so that clock field through-noises inputted from the switch circuits 31 and 32 are not inputted to a differential amplifier circuit, and also switch circuits 11, 12, 51 and 52 are closed immediately before a comparison operation is started by the switch circuit 21 and 22 so that the differential amplifier circuit remains balanced, thereby to realize a high-speed comparator circuit.

9 Claims, 4 Drawing Sheets

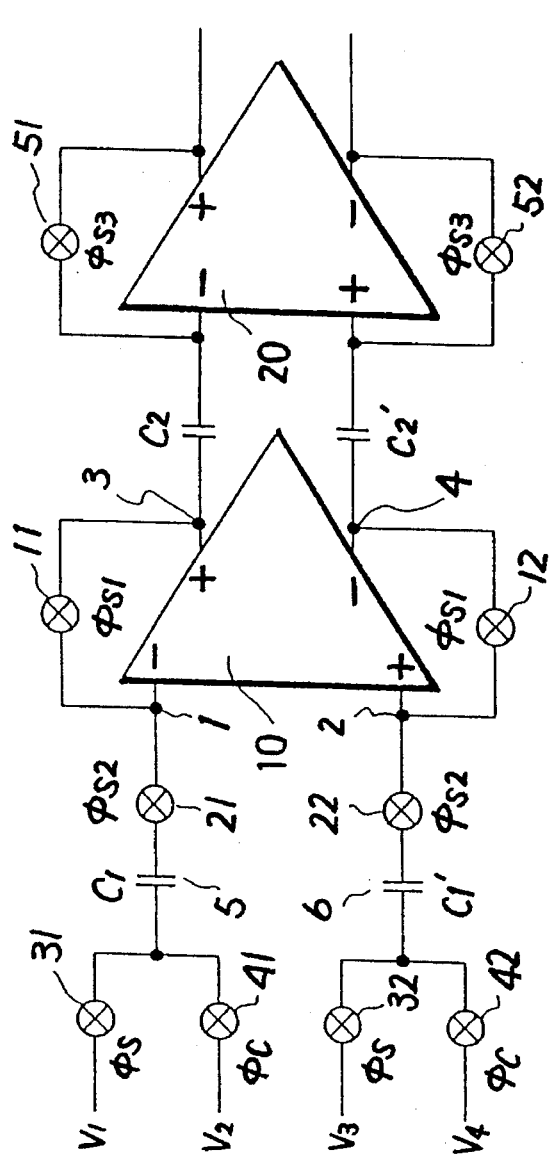
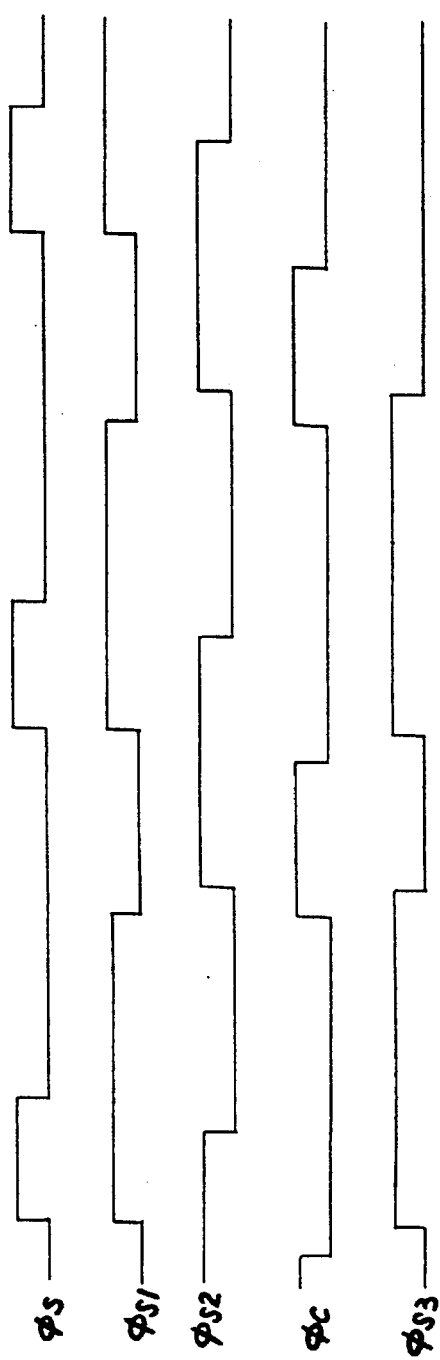
F I G. 1A
F I G. 1B

COMPARATOR CIRCUIT AND METHOD OF CONTROLLING COMPARATOR CIRCUIT

BACKGROUND OF THE INVENTION

The present invention relates to an improved comparator circuit for use in an analog-to-digital conversion circuit apparatus or the like.

Heretofore, in the case of fabricating an A/D converter for converting an analog signal having a video frequency band of approximately 6 MHz into a digital signal using CMOS, there has been known a parallel A/D converter including comparators which compare reference voltages of the number corresponding to the resolution of the A/D converter with analog input signals, and also a serial-parallel A/D converter which classifies digital data into a higher rank and a lower rank for conversion, as a result of which the number of comparators is remarkably reduced in comparison with the parallel A/D converter. Among the converters of this type, in an A/D converter having the resolution of 8 bits or more, an analog/digital hybrid semiconductor integrated circuit device is known in which an A/D converter and a digital signal processing circuit are formed into one chip package, and the like, and because such devices are largely affected by noise from a power source, most frequently used are differential chopper type comparator circuits which use differential amplifier circuits providing strong protection against noise from the power source and remarkably which reduce offset voltage which otherwise causes a problem in a CMOS differential amplifier circuit, for example, as shown in FIG. 2A.

In FIG. 2A, analog switches 11, 12, 31, 32, 41, 42, 51 and 52 are controlled by control signals $\Phi_{S1}$, $\Phi_S$, $\Phi_C$ and $\Phi_{S3}$, respectively, and the respective control signals are applied to the analog switches of comparator circuits shown FIG. 2A in accordance with timing charts shown in FIG. 2B.

In the case where the control signals are applied to an example of the conventional comparator circuit shown in FIG. 2A in accordance with the timing charts of FIG. 2B, the circuit operates in the following manner, assuming that C1 and C1' are equal to each other, and C2 and C2' are also equal to each other in capacitance.

(1) When each of $\Phi_S$, $\Phi_{S1}$ and $\Phi_{S3}$ is at a "H" level and $\Phi_C$ is at a "L" level, one end of capacitors C1 and C1' are applied with input voltages V1 and V3 by the operation of the switches 31 and 32, respectively. Differential amplifier circuits 10 and 20 have input and output terminals which are opposite in phase and short-circuited by the switch circuits 11 and 12 and by the switch circuits 51, 52, respectively. In the differential amplifier circuit 10, an input terminal 1 and an output terminal 3 are connected to each other through the switch circuit 11 whereas an input terminal 2 and an output terminal 4 are connected to each other through the switch circuit 12. In the case where the differential amplifier circuit is formed of a CMOS construction, because circuits shown in FIGS. 3 and 4 are used as the differential amplifier circuit, the input and output voltages of the differential amplifier circuit become constant values determined by the circuit.

(2) When $\Phi_{S1}$ becomes "L" earlier than $\Phi_S$ and $\Phi_{S3}$, the switch circuits 11 and 12, which have allowed the input and output terminals of the differential amplifier circuit 10 to be short-circuited, are opened. At this time, since $\Phi_S$ still remains "H", if a time until $\Phi_S$ is thereafter opened is satisfactorily short in comparison with the change of an analog input signal, the change from the input side is ignored. However, the noise from the control signal caused by opening the switch circuits 11 and 12, that is, clock field through-noises are added to the two input terminals 1 and 2 of the differential amplifier circuit 10 in phase. Since a difference between voltages applied to both ends of the switch circuits 11 and 12 when the respective switch circuits are opened is slight, the clock field through-noises applied to the two input terminals of the differential amplifier circuit 10 are in phase and at the same level, and influence of the clock field through-noises on the circuit characteristics of the comparator can be ignored by the in-phase removing characteristics of the differential amplifier circuit.

(3) Subsequently, when $\Phi_S$ and $\Phi_{S3}$ become "L", the input voltages V1 and V3 are cut off from the capacitors C1 and C1', and the differential amplifier circuit 20 is placed in an operating state by opening the switch circuits 51 and 52 which have allowed the input and output terminals of the circuit 20 to be short-circuited. The clock field through-noises applied to the two input terminals of the differential amplifier circuit 20 are in phase and at the same level, and therefore their influence can be ignored similarly as in the case where $\Phi_{S1}$ becomes "L". However, although the clock field through-noises caused by opening $\Phi_S$ are in phase, if the voltage levels of the input voltages V1 and V3 are different, then the noise levels are also different.. Therefore, the influence of the clock field through-noises cannot be ignored. Because the differential amplifier circuits 10 and 20 are in the operating state, the clock field through-noises are inputted to the two differential amplifier circuits so as to be amplified and then ouputted.

(4) When $\Phi_C$ becomes "H" and the switch circuits 41 and 42 are closed, one respective end of the capacitors C1 and C1' is applied with the analog input voltages V2 and V4. Since the difference between voltages applied to both ends of the capacitors is not changed, an output signal of the differential amplifier circuit 10 is represented by:

$$V_{out} = A(V1 - V2 - V3 + V4)$$

Therefore, the circuit 10 operates as a comparator.

In the example of the conventional comparator circuit shown in FIG. 2A, when the analog switches 11, 12, 31, 32, 51 and 52 are closed, the analog input signals V1 and V3 are stored in the capacitors C1 and C1'. Then, after the analog switches 11 and 12 are opened so that the input terminal of the differential amplifier circuit 10 is opened and is placed in the operating state, the analog switches 31, 32, 51 and 52 are opened thereby to finish the sampling of the analog input signals. The clock field through-noises from the analog switches 11, 12, 51 and 52 are in phase and at the same level, and therefore there arises no problem because of the in-phase removing characteristics of the differential amplifier circuit 10. However, because the clock field through-noises from the analog switches 31 and 32 are in phase but different in noise level, the clock field through-noises are amplified by the differential amplifier circuit 10 which is in the operable state and further amplified by the differential amplifier circuit 20 when a reaction speed is high or a time interval from a time of sampling the analog input signal to a time of starting a comparing operation is long, as in the comparator used in the A/D converter having the video frequency band. For that reason, in the worst case, there rise such problems that the clock field through-noises exceed the linear operating region of the input and output of the differential amplifier circuits, as the result of which the electric charges stored in the capacitors C2 and C2' are lost, or whereby the differential amplifier circuits are inoperable as a comparator, or that the output signals of the differential amplifier circuits 10 and 20 are saturated immediately before the comparing operation starts thereby delaying the operation speed.

SUMMARY OF THE INVENTION

Therefore, in order to solve these problems with the conventional circuit, an object of the present invention is to provide a circuit and a method of controlling switches which are capable of stabilizing the output signals of the differential amplifier circuit for a period of time from a sampling operation to a comparing operation and obtaining a high-speed comparator.

In order to achieve the above-mentioned object, the present invention provides a circuit in which an analog switch is inserted between an input terminal of a first differential amplifier circuit and a capacitor connected to the input terminal, and the input terminal of the differential amplifier circuit and the capacitor are disconnected from each other immediately before the input signal is cut off from the other terminal of the capacitor after the input signal has been sampled, thereby preventing the clock field through-noises from input analog switches from being inputted to the differential amplifier circuit.

As mentioned above, in the comparator having a circuit structure in which the analog switch is added between the first differential amplifier circuit and the input capacitor, when the input terminal of the differential amplifier circuit is disconnected from the capacitor immediately before the sampling of the input signal is terminated, the clock field through-noises caused by cutting off the input signal from the capacitor are not inputted to the differential amplifier circuit. As a result, the influence of the clock field through-noises from the input analog switches on the comparator operation is eliminated. Further, because the differential amplifier circuits can have the input terminals and the output terminals opposite in phase kept in a short-circuited balance state immediately before the comparing operation starts, the differential amplifier circuits can start the comparing operation from an ideal state of a linear and highest reaction speed, thereby being capable of obtaining a stable and high-speed comparator circuit.

BRIEF DESCRIPTION OF THE DRAWING

FIG. 1A shows a comparator in accordance with an embodiment of the present invention.

FIG. 1B shows a timing chart of control signals for comparators in accordance with the embodiment of the present invention.

DETAILED DESCRIPTION OF THE PREFERRED EMBODIMENTS

Figure 2A:
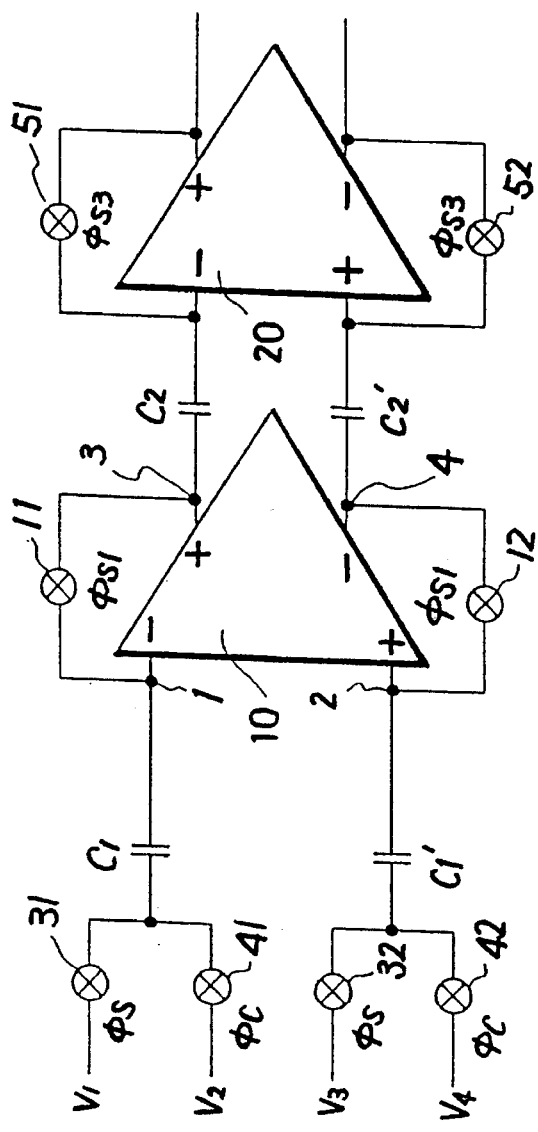
FIGS. 2A and 2B show an example of a conventional comparator circuit and a timing chart of the same.
Figure 2B:
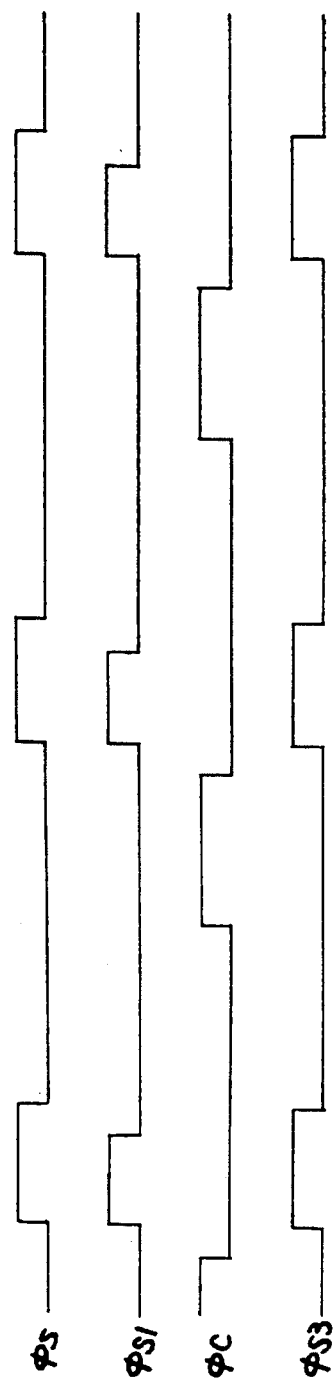

Hereinafter, an embodiment of the present invention will be described with reference to the accompanying drawings.

In FIG. 1A, a comparator circuit of the present invention includes a circuit comprising first switch circuits 11 and 12 for connecting two differential input terminals 1 and 2 of a differential amplifier circuit 10 to inverting output terminals 3 and 4 thereof, respectively; second switch circuits 21 and 22 for connecting the two differential input terminals 1 and 2 of the differential amplifier circuit 10 to one end of at least capacitors C1 and C1', respectively; and third switch circuits 31, 32, 41 and 42 for selectively connecting the other ends of the capacitors C1 and C1' to one of a plurality of input terminals. The two output terminals of the differential amplifier circuit 10 are connected to two input terminals of a differential amplifier circuit 20 through capacitors C2 and C2', respectively and the two input terminals of the differential amplifier circuit 20 are connected to switch circuits 51 and 52 for connecting the input terminals thereof to respective inverting output terminals, respectively.

In the comparator circuit thus described, the open/close operations of the switch circuits 11, 12, 21, 22, 31, 32, 41 and 42 are controlled in accordance with the following order. That is, (1) The switch circuits 11, 12, 21 and 22 are closed, the switch circuits 31 and 32 are closed, and the switch circuits 41 and 42 are then opened whereby analog input signals V1 and V3 are supplied to the other ends of the capacitors C1 and C1', respectively.

(2) The switch circuits 21 and 22 are opened.

(3) The switch circuits 31 and 32 are opened so that the analog input signals V1 and V3 are cut off from the capacitors C1 and C1'.

(4) The switch circuits 11 and 12 are opened.

(5) The switch circuits 41 and 42 are closed so that analog input signals V2 and V4 are supplied to the other ends of the capacitors C1 and C1'.

(6) The switch circuits 21 and 22 are closed.

The order of the steps (4), (5) and (6) may be interchanged if the step (4) is executed earlier than the step (6). Further, the steps (4) and (5) may be simultaneously executed.

FIG. 1B is a timing chart showing a method of controlling the comparator circuit in accordance with the embodiment of the present invention. Hereinafter, the operation of the comparator circuit shown in FIG. 1A according to the invention will be described with reference to the timing chart. Reference marks $\Phi_S$, $\Phi_{S1}$, $\Phi_{S2}$, $\Phi_{S3}$ and $\Phi_C$ shown in FIG. 1B denote signals for controlling the switch circuits 11, 12, 21, 22, 31, 32, 41, 42, 51 and 52 shown in FIG. 1A, and the switch circuit is in an on-state when the control signal is at an "H" level whereas the switch circuit is in an off-state when the control signal is at a "L" level.

As shown in FIG. 1A, the switch circuits 31 and 32 are controlled by the control signal $\Phi_S$, the switch circuits 11 and 12 are controlled by the control signal $\Phi_{S1}$, the switch circuits 21 and 22 are controlled by the control signal $\Phi_{S2}$, the switch circuits 51 and 52 are controlled by the control signal $\Phi_{S3}$, and the switch circuits 41 and 42 are controlled by the control signal $\Phi_C$, assuming that C1 and C1' are equal to each other and C2 and C2' are equal to each other.

Phase 1: When $\Phi_S$, $\Phi_{S1}$, $\Phi_{S2}$ and $\Phi_{S3}$ are at the "H" level whereas $\Phi_C$ is at the "L" level, the ends of the capacitors C1 and C1' connected to switches 21 and 22, respectively, are supplied with the input signals V1 and V3 by the switch circuits 31 and 32. The differential amplifier circuits 10 and 20 have their input terminals and output terminals which are opposite in phase and connected to each other by the switch circuits 11 and 12 and the switch circuits 51 and 52, for example, in the differential amplifier circuit 10, the input terminal 1 is connected to the output terminal 3 whereas the input terminal 2 is connected to the output terminal 4.

Figure 3:
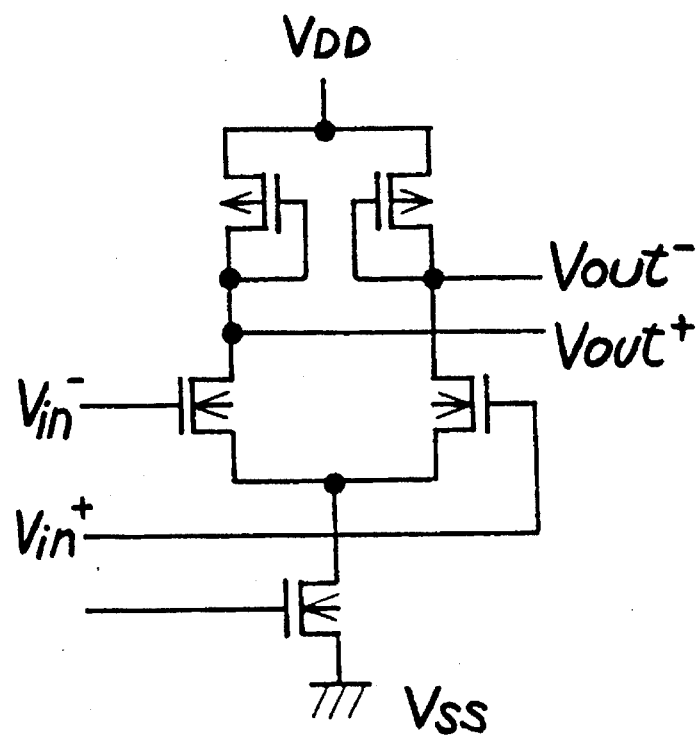
FIG. 3 shows an example of a differential amplifier circuit.
Figure 4:
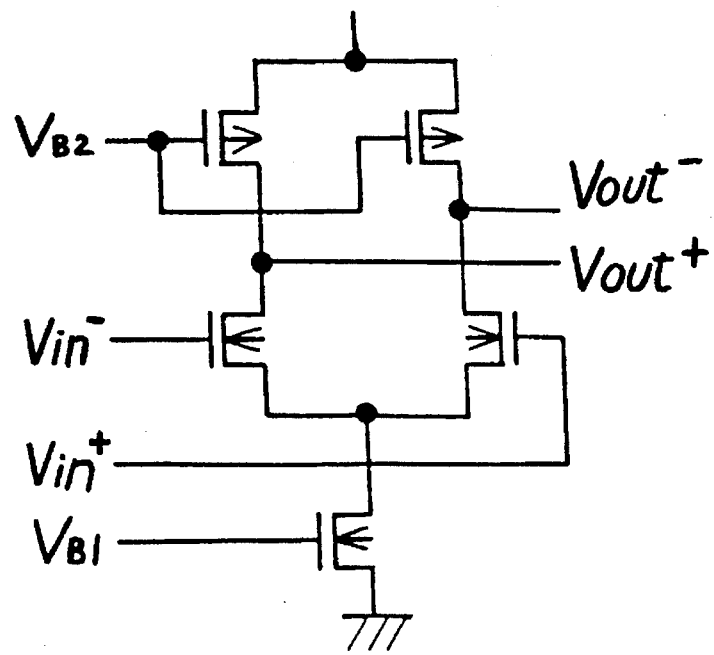
FIG. 4 shows an example of another differential amplifier circuit.

Similarly as in the conventional circuit, the circuit as shown in FIG. 3 or 4 can be used as the differential amplifier circuit, and an input voltage and output voltage are constant values determined by the circuit. In the CMOS differential amplifier circuits as shown in FIGS. 3 and 4, the normal offset voltage is approximately 10 mV, and if the normal offset voltage is $V_{OF}$ and the open loop gain of the differential amplifier circuit is A, then a difference between voltage $V_{f1}$ of the input terminal 1 of the differential amplifier circuit 10 and voltage $V_{f2}$ of the input terminal 2 thereof are expressed by the following expression.

$$V_{f1} - V_{f2} = \{2A/(1+2A)\} \times V_{OF} \approx V_{OF} \qquad (1)$$

Phase 2: When $\Phi_{S2}$ becomes "L" earlier than $\Phi_S$, $\Phi_{S1}$ and $\Phi_{S2}$, the switch circuits 21 and 22 are opened whereby the capacitors C1 and C1' are disconnected from the input terminals 1 and 2 of the differential amplifier circuit 1. At this time, sampling of the input voltages V1 and V2 is completed. The clock field through-noises are inputted to C1 and C1' by changing the state of $\Phi_{S2}$ to "L". Since the difference between both ends of the respective switch circuits 21 and 22 immediately before $\Phi_{S2}$ becomes "L" as represented by expression (1), that is, the voltage difference between the input terminals 1 and 2 of the differential amplifier circuit 10 is very slight in comparison with the amplitude of $\Phi_{S2}$, the clock field through-noises inputted into C1 and C1' are in phase and of the same level.

Phase 3: Subsequently to $\Phi_{S2}$, when $\Phi_S$ becomes "L", the switch circuits 31 and 32 are opened so that C1 and C1' are cut off from V1 and V3. Even in this case, the clock field through-noises are inputted to C1 and C1'. However, since the other terminals 5 and 6 of C1 and C1' have been already disconnected from the input terminals of the differential amplifier circuit 10 by the switch circuits 21 and 22, floating capacitances in the terminals 5 and 6 are sufficiently smaller than C1 and C1'. As a result, the influence of the clock field through-noises from $\Phi_S$ on the charge stored in C1 and C1' can be ignored.

Phase 4: Subsequently, when $\Phi_{S1}$ becomes "L" and $\Phi_C$ becomes "H", the switch circuits 11 and 12, which have allowed the input and output terminals of the differential amplifier circuit 10, which are opposite in phase, to be short-circuited, are opened, and the switch circuits 41 and 42 are closed so that the terminals of C1 and C1' are applied with the input signals V2 and V4, respectively. The clock field through-noises from the switch circuits 11 and 12 are inputted to the input terminals 1 and 2 of the differential amplifier circuit 10, however, even in this case, the voltage difference between the input terminals 1 and 2 are very slight in comparison with the amplitude of $\Phi_{S1}$ as represented by expression (1). The clock field through-noises are in phase and of the same level, and are therefore removed due to the in-phase removing characteristics of the differential amplifier circuit 10.

Phase 5: When $\Phi_{S2}$ becomes "H" and $\Phi_{S3}$ becomes "L", the switch circuits 21 and 22 are closed and the switch circuits 51 and 52 are opened. The input terminals 1 and 2 of the differential amplifier circuit 10 are again connected to the capacitors of C1 and C1' by closing the switch circuits 21 and 22. Since, in the phase 4, differential amplifier circuit 10 is in the operating state and the differential amplifier circuit 20 is also in the operating state with the switch circuits 51 and 52 opened, the comparison operation of the input voltage as the comparator circuit is started from this time. The input voltage V1 and V3 are stored in C1 and C1' in the phase 1, and V2 and V4 are inputted thereto in the phase 4. The noises supplied from the switch circuits 21 and 22 in the phase 2 are in phase and of the same level, and the charges stored in C1 and C1' are not changed from the phase 3. Therefore, if voltages at the other terminals 5 and 6 of the capacitors C1 and C1' are $V_{f1}'$ and $V_{f2}'$, respectively, the following expression is satisfied:

$$V_{f1}' - V_{f2}' = V2 - V1 - (V4 - V3) \qquad (2)$$

Because $V_{f1}'$ and $V_{f2}'$ are applied to the input terminals of the differential amplifier circuit 10 by closing the switch circuits 21 and 22, the positively inverted output voltage $V_{out}$ of the differential amplifier circuit 10 is represented by the following expression.

$$V_{out} = A \ (V1 - V2 - V3 + V4) \qquad (3)$$

From this expression, it is understood that the $V_{out}$ is operative as the comparator circuit.

The timing of changing the state of $\Phi_{S3}$ to "L" to open the switch circuits 51 and 52 is preferably letter than the timing of changing the state of $\Phi_{S2}$ to "L" to open the switch circuits 11 and 12.

As described above, the switch circuits 21 and 22 are inserted between the differential amplifier circuit 10 and the capacitors C1 and C1' in the circuit of the invention shown in FIG. 1A, and the open/close operations of the respective switch circuits are controlled in accordance with the timing chart shown in FIG. 1B, whereby the clock field through-noises from the input switch circuits 31 and 32, which result in the problem in the conventional comparator circuit, are not inputted to the differential amplifiers. In the conventional comparator circuit, although the influence of the clock field through-noises on the comparison operation per se as the comparator is reduced, they are inputted to the differential amplifier circuit which is in the operating state. As a result, the clock field through-noises are amplified to be outputted. When the actual comparison operation is started, if the differential amplifier circuit is going to generate an output signal reverse to the previous output signal, it takes time to return the output signal to the original by the amplifying amount, the comparison time of the comparator circuit is excessively required. When the clock field through-noises are large, the output signal of the differential amplifier circuit is saturated so that the comparison operation per se may not be performed.

In the comparator circuit of the present invention, the clock field through-noises from the input switch circuits 31 and 32 are not inputted to the differential amplifier circuit because the switch circuits 21 and 22 are opened, and also the differential amplifier circuit can remain balanced so that the input and output terminals thereof are short-circuited immediately until the comparison operation starts in the phase 5. For that reason, even when the same differential amplifier circuit is used, it can be operated with the shortest comparison time. By adding the switch circuits 21 and 22, the clock field through-noises from the switch circuits are cured. However, as was described in the phase 2 description, the noises inputted to C1 and C1' does not adversely affect the differential amplifier circuit due to the in-phase removing characteristics of the differential amplifier circuit because they are in phase and at the same level.

Figure 5:
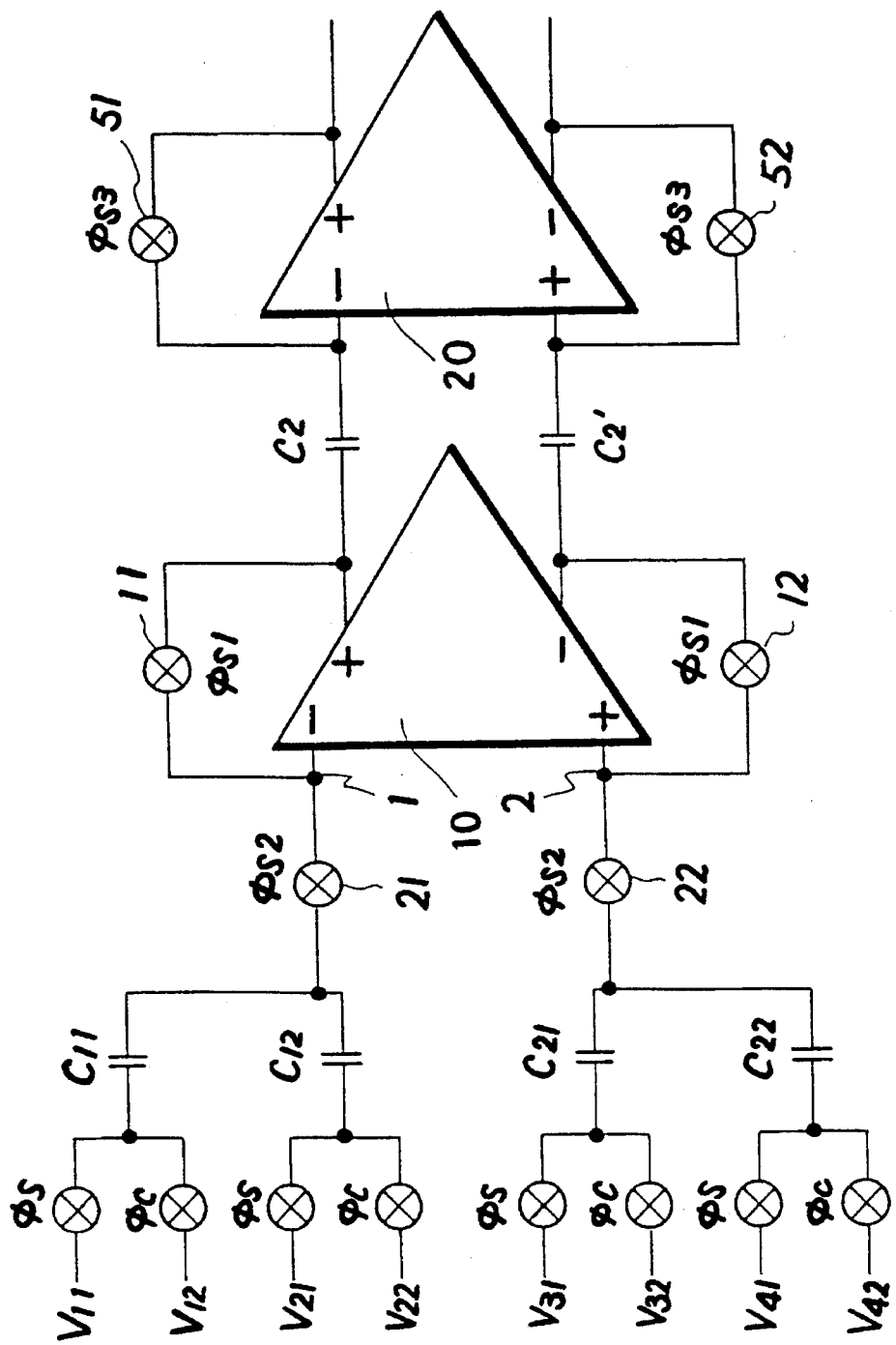
FIG. 5 shows a comparator circuit in accordance with another embodiment of the present invention.

Another embodiment of the present invention will be described with reference to FIG. 5. Likewise, in this embodiment, switch circuits 21 and 22 are inserted between C11, C12, C21, C22 and input terminals 1, 2 of the differential amplifier circuit 10, respectively, so that a high-speed comparator circuit can be realized without any influence of the clock field through-noises from the input switch circuit.

Further, even in the case where the comparator of the present invention is subjected to integration, the number of switch circuits is only slightly increased in comparison with the conventional circuit, and therefore the increase in the entire layout area is confined to a minimum.

As described above, according to the present invention, the switch circuits are added to two input terminals of the differential amplifier circuit, and the respective switch circuits are controlled so that the clock field through-noises inputted from the input switch circuits are not inputted to the differential amplifier circuit. As a result, a high-speed comparator can be realized.

What is claimed is:

1. A comparator circuit comprising: a plurality of signal input terminals for receiving analog input signals; a differential amplifier having a plurality of input terminals and a corresponding plurality of output terminals for producing amplified output signals in accordance with a level difference between analog input signals applied to the input terminals; first switch means for selectively connecting input terminals of the differential amplifier to respective output terminals of the differential amplifier; a plurality of capacitors; second switch means for selectively connecting the input terminals of the differential amplifier to a first electrode of the respective capacitors; and third switch means for selectively connecting each one of the plurality of signal input terminals to a second electrode of the respective capacitors such that the second switch means is effective to isolate the differential amplifier from noise generated by the third switch means.

2. A comparator circuit according to claim 1; wherein the differential amplifier has a CMOS structure.

3. A method of controlling a comparator circuit including a first switch circuit for connecting two input terminals of a differential amplifier to respective output terminals corresponding to the two input terminals; a second switch circuit for connecting the two input terminals of the differential amplifier to a respective first terminal of at least one capacitor; and a third switch circuit for selectively connecting one of a plurality of signal input terminals to a respective second terminal of the at least one capacitor, the method comprising the steps of:

(a) closing the third switch circuit and then closing the first and second switch circuits to select a first signal input terminal from the plurality of signal input terminals to connect the first signal input terminal to a respective second terminal of the at least one capacitor through the third switch circuit;

(b) opening the second switch circuit;

(c) opening the third switch circuit so that the first input terminal is cut off from the at least one capacitor;

(d) opening the first switch circuit;

(e) closing the second switch circuit; and (f) closing the third switch circuit to select a second signal input terminal from the plurality of signal input terminals to connect the second signal input terminal to a respective second terminal of the at least one capacitor through the third switch circuit.

4. A method of controlling a comparator circuit according to claim 3; wherein steps (a) and (b) are performed prior to step (c).

5. A method of controlling a comparator circuit according to claim 3; wherein steps (d) and (e) are performed prior to step (f) and wherein step (d) is performed prior to step (e).

6. A comparator comprising: a plurality of signal input terminals for receiving a plurality of analog input signals; amplifier means having a plurality of input terminals and a plurality of output terminals for providing output signals in accordance with a level difference between signals applied to the input terminals thereof; first switch means for selectively short-circuiting each of the output terminals of the amplifier means to a respective input terminal; a plurality of capacitors; second switch means for selectively connecting a first terminal of the respective capacitors to the respective input terminals of the amplifier means; and third switch means connected to the signal input terminals and to a second terminal of each of the respective capacitors for providing a selected input signal from the plurality of input signals to the amplifying means such that the second switch means is effective to isolate the amplifier means from noise generated by the third switch means.

7. A comparator according to claim 6; wherein the amplifier means comprises a differential amplifier having a CMOS construction.

8. A comparator according to claim 6; wherein the differential amplifier means comprises a first differential amplifier having a pair of input terminals each connected to the first and of a respective capacitor, a pair of output terminals for providing output signals in accordance with a difference in level between signals appearing at the input terminals, and a second differential amplifier having a pair of input terminals coupled to the output terminals of the first differential amplifier and a pair of output terminals for providing output signals in accordance with a difference in level between signals appearing at the input terminals thereof, and wherein the first switch means comprises first and second switches for selectively short-circuiting a respective output terminal of the first differential amplifier to a respective input terminal thereof, and third and fourth switches for selectively short-circuiting the respective output terminals of the second differential amplifier to the respective input terminals.

9. A comparator according to claim 8; further including a pair of capacitors disposed between the first and second differential amplifiers.

* * * * *